(12) United States Patent
Prest et al.

(10) Patent No.: US 9,945,613 B2
(45) Date of Patent: Apr. 17, 2018

(54) HEAT EXCHANGERS IN SAPPHIRE PROCESSING

(71) Applicant: Apple Inc., Cupertino, CA (US)

(72) Inventors: Christopher D. Prest, San Francisco, CA (US); Dale N. Memering, San Francisco, CA (US)

(73) Assignee: APPLE INC., Cupertino, CA (US)

(*) Notice: Subject to any disclaimer, the term of this patent is extended or adjusted under 35 U.S.C. 154(b) by 593 days.

(21) Appl. No.: 13/623,645

(22) Filed: Sep. 20, 2012

(65) Prior Publication Data

US 2014/0080081 A1    Mar. 20, 2014

(51) Int. Cl.

| | |
|---|---|
| *F27D 17/00* | (2006.01) |
| *F27B 19/00* | (2006.01) |
| *F27B 19/04* | (2006.01) |
| *C30B 11/00* | (2006.01) |
| *C30B 15/34* | (2006.01) |
| *C30B 19/00* | (2006.01) |
| *C30B 19/08* | (2006.01) |
| *C30B 29/20* | (2006.01) |
| *C30B 33/02* | (2006.01) |

(52) U.S. Cl.
CPC ........... *F27D 17/004* (2013.01); *C30B 11/00* (2013.01); *C30B 11/003* (2013.01); *C30B 15/34* (2013.01); *C30B 19/00* (2013.01); *C30B 19/08* (2013.01); *C30B 29/20* (2013.01); *C30B 33/02* (2013.01); *F27B 19/00* (2013.01); *F27B 19/04* (2013.01)

(58) Field of Classification Search
CPC ................ F27D 17/00; F27D 17/004
USPC .................. 432/1, 30, 94, 209, 216; 165/10
See application file for complete search history.

(56) References Cited

U.S. PATENT DOCUMENTS

| | | | |
|---|---|---|---|
| 3,293,002 A | | 12/1966 | Werner |
| 4,095,647 A | * | 6/1978 | Asselman et al. ....... 165/104.26 |
| 4,248,645 A | | 2/1981 | Jewett |
| 4,303,465 A | * | 12/1981 | Bagdasarov et al. .......... 117/82 |
| 4,335,081 A | | 6/1982 | Sachs |
| 4,349,367 A | * | 9/1982 | Krumwiede ............ C03B 3/023 165/111 |
| 4,681,718 A | | 7/1987 | Oldham |
| 5,035,593 A | | 7/1991 | Huang et al. |
| 5,049,064 A | * | 9/1991 | Wills ..................... F23L 15/02 431/11 |

(Continued)

FOREIGN PATENT DOCUMENTS

| | | |
|---|---|---|
| DE | 4200185 | 7/1992 |
| EP | 0289128 A1 * | 11/1988 ............. F27B 19/00 |

(Continued)

OTHER PUBLICATIONS

U.S. Appl. No. 14/172,375, filed Feb. 4, 2014, Douglas Weber.
U.S. Appl. No. 13/631,602, filed Sep. 28, 2012, Dale N. Memering.

*Primary Examiner* — Alissa Tompkins
*Assistant Examiner* — John Bergero
(74) *Attorney, Agent, or Firm* — Brownstein Hyatt Farber Schreck, LLP

(57) ABSTRACT

Systems and methods are presented for efficient heating during production of corundum. One embodiment takes the form of a system for processing corundum including a first furnace and a second furnace. The first and second furnaces are sequentially arranged and heat from the first furnace is subsequently used to heat the second furnace.

16 Claims, 9 Drawing Sheets

(56) References Cited

U.S. PATENT DOCUMENTS

| | | | |
|---|---|---|---|
| 5,820,649 | A | 10/1998 | Ogure et al. |
| 6,066,279 | A | 5/2000 | Walls et al. |
| 6,152,211 | A | 11/2000 | Klug et al. |
| 6,280,662 | B1 | 8/2001 | Beratan et al. |
| 6,368,525 | B1 | 4/2002 | Klug et al. |
| 7,430,880 | B2 | 10/2008 | Butts et al. |
| 7,682,452 | B2 | 3/2010 | Outwater |
| 7,713,896 | B2 | 5/2010 | Henneck et al. |
| 7,993,476 | B2 | 8/2011 | Nakazono et al. |
| 8,075,827 | B2 | 12/2011 | Loukus et al. |
| 8,201,615 | B2 * | 6/2012 | Soukhojak ............ C09K 5/063 165/10 |
| 8,628,708 | B2 | 1/2014 | Del-Gallo et al. |
| 8,652,658 | B2 | 2/2014 | Tatartchenko et al. |
| 8,980,115 | B2 | 3/2015 | Bibl et al. |
| 9,814,151 | B2 | 11/2017 | Probst |
| 2009/0099003 | A1 | 4/2009 | Matsuoka et al. |
| 2009/0140982 | A1 | 6/2009 | Chen et al. |
| 2011/0256377 | A1 | 10/2011 | Chiruvolu et al. |
| 2011/0302962 | A1 | 12/2011 | Gattermann et al. |
| 2013/0236699 | A1 | 9/2013 | Prest et al. |
| 2014/0090592 | A1 | 4/2014 | Memering et al. |
| 2015/0217479 | A1 | 8/2015 | Matsuyuki et al. |
| 2016/0270247 | A1 | 9/2016 | Jones et al. |

FOREIGN PATENT DOCUMENTS

| | | |
|---|---|---|
| EP | 0345022 | 12/1989 |
| JP | 53073481 | 6/1978 |
| JP | S57143624 | 9/1982 |
| JP | S59048805 | 3/1984 |
| JP | 59097593 | 6/1984 |
| JP | S59111128 | 6/1984 |
| JP | S61028507 | 2/1986 |
| JP | H01156006 | 6/1989 |
| JP | H01304902 | 12/1989 |
| JP | H04104933 | 4/1992 |
| JP | 10158088 | 6/1998 |
| JP | H11165309 | 6/1999 |
| JP | 2000280211 | 10/2000 |
| JP | 2002305316 | 10/2002 |
| JP | 2004039931 | 2/2004 |
| JP | 3601791 | 12/2004 |
| JP | 2007276293 | 10/2007 |
| JP | 2008501605 | 8/2008 |
| JP | 4245856 | 4/2009 |
| JP | 2010504274 | 2/2010 |
| JP | 2010540390 | 12/2010 |
| JP | 4618426 | 1/2011 |
| JP | 2011502099 | 1/2011 |
| JP | 2011504451 | 2/2011 |
| JP | 2014070016 | 4/2014 |
| TW | M438642 | 10/2012 |
| WO | WO2001/090028 | 11/2001 |
| WO | WO2005121034 | 12/2005 |
| WO | WO2008036888 | 3/2008 |
| WO | WO2009058293 | 5/2009 |
| WO | WO2009067641 | 5/2009 |

* cited by examiner

HEAT EXCHANGERS IN SAPPHIRE PROCESSING

TECHNICAL FIELD

The present application is directed to heat exchangers and, more particularly, to heat exchangers that may be implemented as part of a crystalline growth and/or annealing process.

BACKGROUND

Corundum is a crystalline form of aluminum oxide and is found in various different colors, all of which are generally commonly referred to as sapphire except for red corundum which is commonly known as ruby and pinkish-orange corundum which is known as padparadscha. Transparent forms of corundum are considered precious stones or gems. Generally, corundum is extraordinarily hard with pure corundum defined to have 9.0 Mohs and, as such, is capable of scratching nearly all other minerals. The terms "corundum" and "sapphire" are generally interchangeable as used herein.

As may be appreciated, due to certain characteristics of sapphire, including its hardness and transparent characteristics, among others, it may be useful in a variety of different applications. However, the same characteristics that are beneficial for particular applications commonly increase both the cost and difficulty in processing and preparing the sapphire for those applications. As such, beyond costs associated with it being a precious stone, the costs of preparing the corundum for particular uses is often prohibitive. For example, the sapphire's hardness makes cutting and polishing the material both difficult and time consuming when conventional processing techniques are implemented. Further, conventional processing tools such as cutters experience relatively rapid wear when used on corundum.

SUMMARY

Systems and methods are presented for efficient heating during production of corundum. One embodiment may take the form of a system for processing corundum including a first furnace and a second furnace. The first and second furnaces are sequentially arranged and heat from the first furnace is subsequently used to heat the second furnace.

Another embodiment may take the form of a method of operating multiple furnaces in sapphire processing. The method includes operating a first furnace and routing heat from the first furnace to a second furnace. The heat from the first furnace preheats the second furnace. The method also includes operating the second furnace subsequent to the operation of the first furnace.

Yet another embodiment may take the form of a heating system for sapphire production. The heating system includes a heat battery and a plurality of furnaces. Each furnace includes a heat exchanger. The heating system further includes an insulated network of piping in communication with the heat battery and each of the plurality of furnaces. Heat is transferred within the system between the heat battery and the plurality of furnaces via the network of piping and the heat exchangers.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Figure 1:
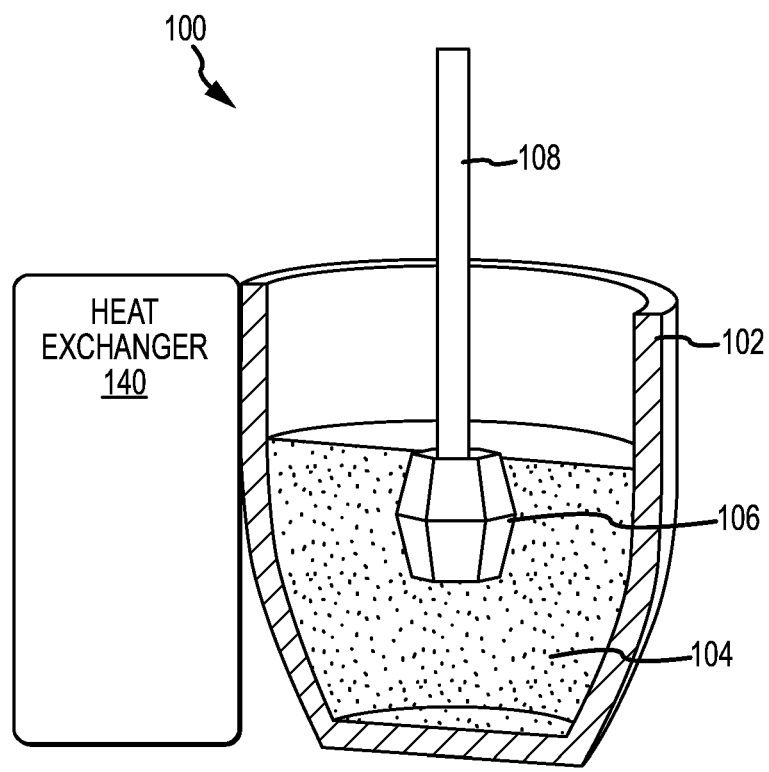
FIG. 1 illustrates a Kyropoulos process for sapphire growth.
Figure 2:
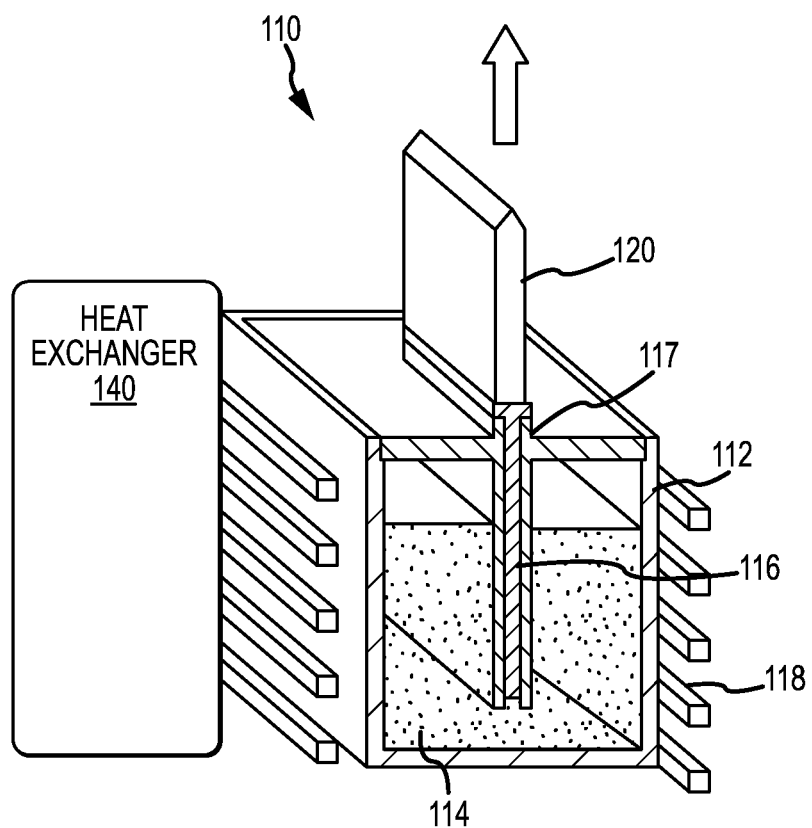
FIG. 2 illustrates an EFG process for sapphire growth.

As mentioned above, certain properties of sapphire lead to significantly higher energy costs to produce a given part compared to alternative materials such as glass. Specifically, for example, the sapphire growth process and annealing process are two high energy consumption steps in the part production for sapphire where more efficient heating processes may help achieve high volume sapphire production in an economically efficient manner.

Sapphire growth occurs at temperatures around 2200 degrees Celsius and, depending on the growth technique employed and the output size, is a process that can take from eight hours to over a week in duration. Annealing is a secondary processing step (e.g., different from a post-growth annealing that is generally common to most growth methods) that occurs downstream after most part figuration is complete to eliminate residual stresses and "heal" processing defects that can lead to decreased mechanical reliability and strength.

The annealing step can last as long as 30 hours at temperatures as high as 1900 degrees Celsius. Glass on the other hand is formed rather quickly at around 1300 degrees Celsius and chemically strengthened (the high temperature post formation processing step analogous to sapphire annealing) in a bath for generally around 10 hours at approximately 400 degrees Celsius. Since such a large disparity exists in terms of energy requirements to fabricate a part from sapphire compared to glass, efficiencies in heating may contribute to sapphire processing becoming economically efficient and a viable alternative to glass in consumer electronic products as well as other applications.

One embodiment may include linking all heating and cooling systems of the growers and furnaces together so that much less heat is wasted and greater efficiencies could be realized. Specifically, furnaces (either or both annealing and growth furnaces) could have their heating and cooling systems linked to other systems through heat exchanges. By staggering the processing schedules among groups of machines, heat that is removed from one furnace could be fed directly into another furnace to reduce the energy input requirement of its heating step. This could be achieved using some thermal fluid (water/pressurized steam, alcohol, solutions, molten salts, and so on) and an insulated network of piping within a cell of linked machines. As used herein, the term "furnace" may generally refer to a heating system or device which facilitates achieving temperatures for either growth or annealing of sapphire. As such, the furnaces referred to herein may include heat sources (e.g., heating elements), insulation, crucibles, and so forth.

In another embodiment, furnaces could all be linked to a central heat "battery" instead of directly to each other, when a furnace needs to expel heat, such as during the cooling stage of an annealing furnace, or the solidification phase of crystal growth process, it would release the heat to the central heat mass and charge the battery. Conversely, during the initial heating of the furnaces, they would discharge the battery and pull heat in through a heat exchanger.

Yet another configuration may utilize a heat source that would be more efficient than the electrical heater utilized in the furnaces to generate heat to supply to a large number of furnaces thereby supplementing the electrical heating of the furnaces with more efficient energy input at the early, less sensitive heating stages. This may be used in conjunction with other methods, with the goal of reducing cost and environmental impacts of replacing glass with sapphire.

Generally, the process of growing sapphire starts with alumina powder that is subjected to a densification process to form densified alumina or fully formed sapphire (crackle). The alumina is melted and a seed crystal is inserted into the molten alumina. The molten alumina is then cooled with precisely controlled temperatures and the crystal is formed on the seed. Additional processing steps such as cutting and polishing the formed crystal may be performed, as well as annealing steps to help "heal" the crystalline structure that may have formed during growth or subsequent processing, as mentioned above.

Some common and distinct growth methods include Kyropoulos, Verneuil, Czochralski, flux, heat exchange method ("HEM"), hydrothermal, vertical horizontal gradient freezing ("VHGF"), Stepanov (i.e., edge-defined film-fed growth ("EFG")), and Bridgman (i.e., horizontal moving growth). The Kryopoulos, Verneuil, Czochralski, flux, and hydrothermal processes generate a sapphire boule, whereas the EFG, VHGF and horizontal moving growth processes generate sapphire members having continuous cross-sections. It should be appreciated that although specific examples described herein may refer to a particular process for sapphire growth the examples are not intended to be limiting. As such, the present techniques, systems and methods may be used in conjunction with each of the various sapphire growth processes.

Turning to the drawings and referring initially to FIG. 1, a system 100 for performing the Kyropoulos process is illustrated in by a cross-sectional view of a crucible 102. The crucible 102 holds the alumina melt 104 and a seed crystal 106 is inserted into the crucible 102 with a support rod 108. Crystallization of the molten alumina 104 occurs on the seed crystal 106 following the orientation of the seed crystal. In some embodiments, the rod 108 may be configured to reorient the seed crystal to achieve a desired crystallographic orientation.

A system 110 for growing sapphire according to the EFG process is illustrated with a cross-sectional view of crucible 112. The crucible 112 holds alumina melt 114 or molten alumina. Heating elements 118 may surround and heat the crucible 112. The heating elements 118 may take any suitable form and in some embodiments may take the form or electrical heating elements.

The molten alumina 114 is drawn up a melt supply slit of a die 116 which may take the form of two close, parallel plates which draw the molten alumina up through capillary action. The die 116 may extend to a die tip 117 at a boundary of the crucible. A seed crystal (not shown) may be brought into contact with the molten alumina at the die tip 117 which propagates crystalline growth and a sapphire ribbon 120 may be drawn upwardly out of the crucible 112. The sapphire ribbon 120 is formed in the shape of the die tip 117 and the sapphire crystalline structure of the ribbon follows the existing orientation of the seed.

Figure 3:
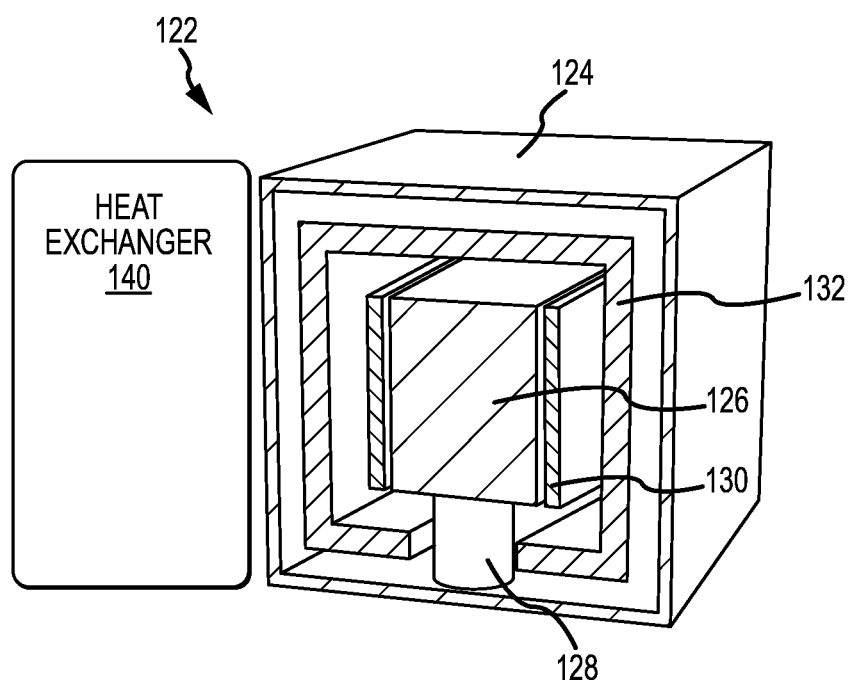
FIG. 3 illustrates a VHGF process for sapphire growth.

A system 122 for growing sapphire according to the VHGF process is illustrated in FIG. 3, with a cross-sectional view of a chamber 124. The chamber 124 surrounds an alumina charged crucible 126 into which a seed crystal is positioned at the bottom of the crucible. A heat sink 128 and heater 130 are each coupled to crucible 126 and an insulator 132 is provided within the chamber around the heater and crucible. The heater 130 melts the alumina in the crucible and the melted alumina is subsequently cooled by the heat sink 128 to form crystal in the shape of the crucible and following the orientation of the seed crystal. The crucible 126 is cracked off the crystal once cooled.

A heat exchanger 140 may be included with each system 100, 110 and 122, to transfer heat from or to the system as discussed herein. The heat exchanger 140 may be either a parallel-flow or counter-flow heat exchanger and may take any suitable form including but not limited to a shell and tube heat exchanger, a plate heat exchanger, a plate and shell heat exchanger, fluid heat exchanger, pillow plate heat exchanger, phase-change heat exchanger, direct contact heat exchanger, and so forth.

Figure 4A:
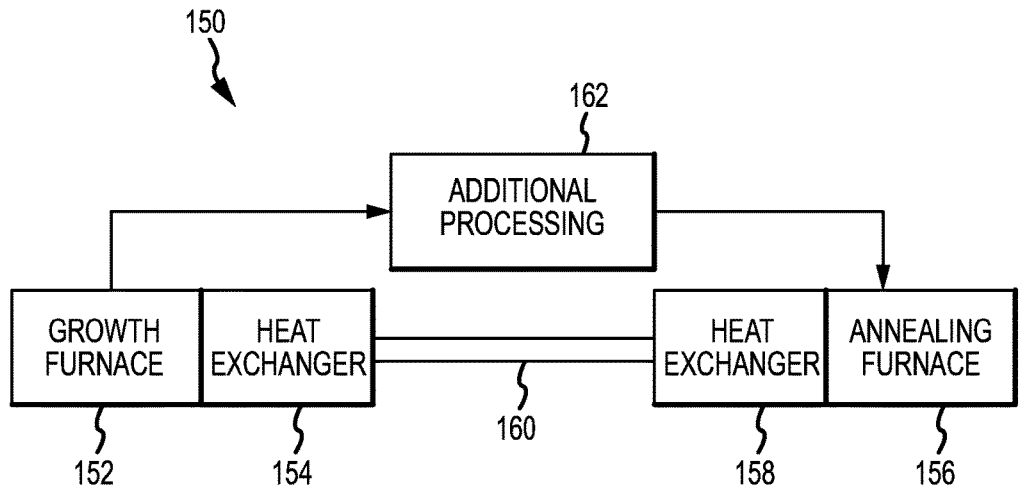
FIG. 4A illustrates a system for recycling heat in sapphire processing by passing heat directly between two furnaces after heating phases for the furnaces.

FIG. 4A illustrates an example sapphire processing system 150 in accordance with an example embodiment. The system includes a growth furnace 152 and a corresponding heat exchanger 154, and an annealing furnace 156 with a corresponding heat exchanger 158. For the present purposes, the growth furnace 152 may be part of an EFG system for growing sapphire, such as the system 110. The growth furnace 152 and the annealing furnace 156 may be configured to share heat. In particular, for example, the furnace 152 may initially operate to grow the sapphire crystal and reach temperatures around 2200 degrees Celsius. The annealing furnace 156 may operate at some time after the growth furnace 152 and heat from the growth furnace may be transferred to the annealing furnace to help initially heat the annealing furnace. As such, the furnaces are sequentially heated and the heat from one furnace is used to initially heat (or preheat) the other furnace).

The heat from the furnaces may be passed between the furnaces via an insulated network of piping 160, conduits, or other suitable liquid or gas transport system. The sapphire grown in the growth furnace 152 may be passed to other processing steps 162 such as a cutting step before being placed in the annealing furnace 156. In some embodiments, an annealing step may be performed shortly or immediately after growth and cooling of the sapphire. As such there may be multiple annealing steps in the processing of the sapphire and each annealing step may utilize recycled heat. Additionally, in some embodiments, heat may be shared between two or more growth furnaces and/or two or more annealing furnaces.

In some embodiments, upon completion of the annealing processes, heat from the annealing furnace 156 may be transferred back to the growth furnace 152, or to another furnace or heating step in the processing of the sapphire. In other embodiments, the heat from one or both of the growth furnace 152 and annealing furnace 156 may be transferred to a system external to the sapphire processing system. For example, the heat may be used to heat water and/or be used for heating and ventilation purposes. As such, the heat generated from one or more furnaces in the system 150 may be conserved and recycled for multiple steps in the creation of sapphire and/or may be utilized for purposes external to the sapphire processing.

Figure 4B:
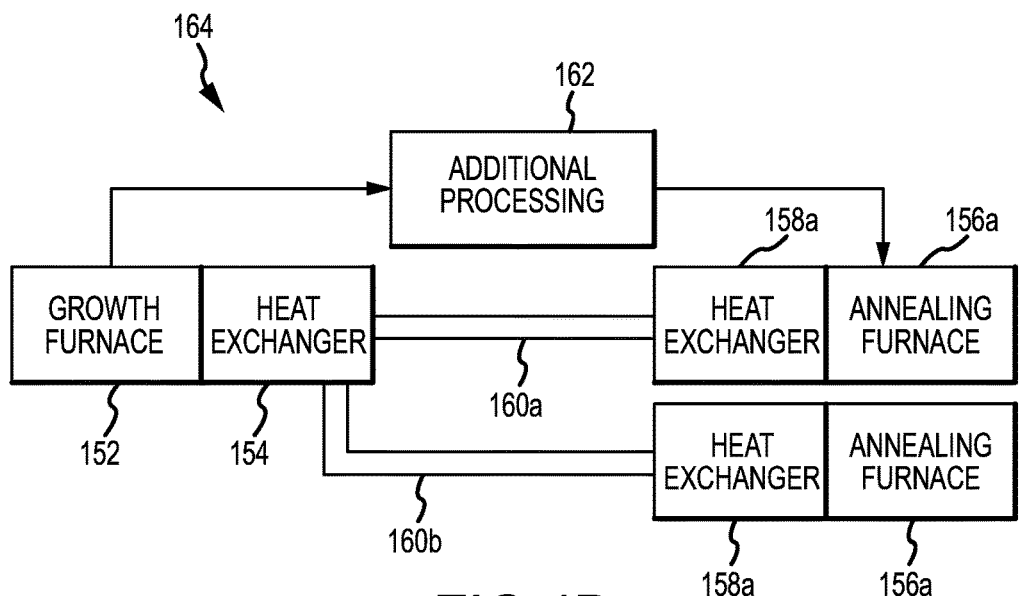
FIG. 4B illustrates an alternative system for recycling heat in sapphire processing by passing heat directly between two furnaces after heating phases for the furnaces wherein a single growth furnace supplies heat to two annealing furnaces.

The recycling of heat or energy from the furnaces may result in significant savings, especially when the scale of sapphire production includes many furnaces. In large production environment tens, hundreds or even thousands of furnaces may be operating and the savings in both time and energy costs may be significant. In the large production systems, one growth furnace 152 may provide heat to multiple annealing furnaces 156a, 156b, as shown in system 164 of FIG. 4B. Alternatively, heat from multiple growth furnaces may be provided to a single annealing furnace and vice-versa. Additionally, in large production facilities, the furnaces may be coupled together in a cellular topology with each cell having multiple furnaces coupled together by the insulated piping so that multiple furnaces within a single cell may share heat or so that heat may be recycled within the cell.

Figure 5:
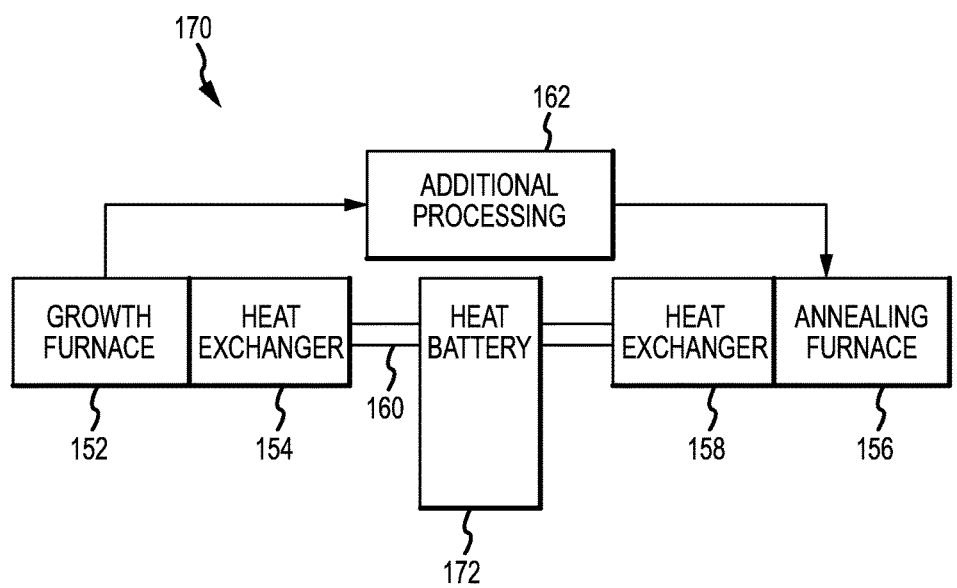
FIG. 5 illustrates another alternative system for recycling heat in sapphire processing by implementing a heat battery.

Turning to FIG. 5, an alternative system 170 for heat conservation in sapphire production is illustrated. Generally, the system 170 includes the furnaces 152, 154 and the heat exchangers 154, 158. Additionally, the system 170 includes a heat battery 172. The heat battery 172 is created for storage and distribution of heat within the system 170. As such, heat from the furnaces 152, 156 is routed to the heat battery 172 at the completion of a heating phase to "charge" the battery. When it is time to preheat a furnace, heat is dispersed to the furnaces from the heat battery 172. This configuration may be particularly beneficial in large cell topologies (e.g., multiple growth furnaces and/or multiple annealing furnaces) where it may be difficult to have each furnace coupled to every other furnace. Thus, the heat battery 172 helps to efficiently retrieve and redistribute heat within the system.

The heat battery 172 may take any suitable form of a storage volume for collection and distribution of a thermal fluid. The heat battery 172 may include valves that coordinate with valves of heat exchanges associated with various furnaces so that the thermal fluid may be passed between the heat battery and the furnaces. The heat battery 172 may be well insulated to prevent heat loss. Additionally, in some embodiments, the heat battery 172 may include a heater to help maintain the thermal fluid at a desired temperature and/or to heat the thermal fluid.

Figure 6:
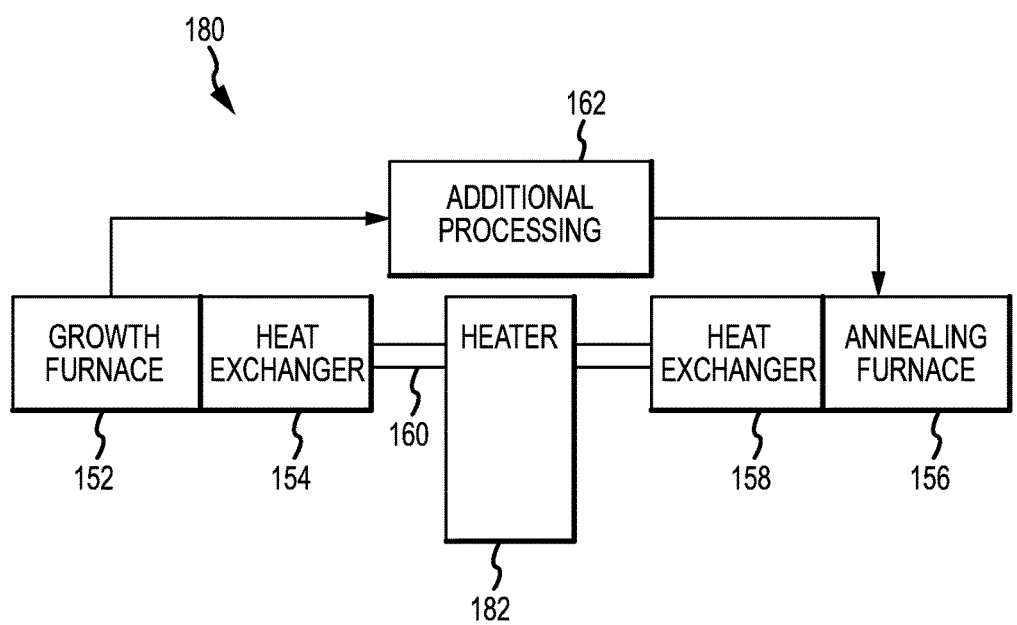
FIG. 6 illustrates yet another alternative system for recycling heat in sapphire processing by implementing a central heater.

FIG. 6 illustrates yet another alternative system 180 in which a central heater 182 may be coupled to the furnaces and supply heat to the furnaces. In particular, the heater 182 may utilize a cheaper heating fuel and/or technique than the furnaces and may generally operate at lower temperatures. For example, the heater may utilize natural gas or other combustible fuel. The central heater 182 generally may not operate at a high level of precision as it may be purposed for preheating, while the furnaces may utilize a precisely controlled electrical heater or other type of heating. Additionally, the heater 182 may operate at relatively low temperatures as compared to the furnaces used for crystal growth and annealing of the sapphire.

Figure 7:
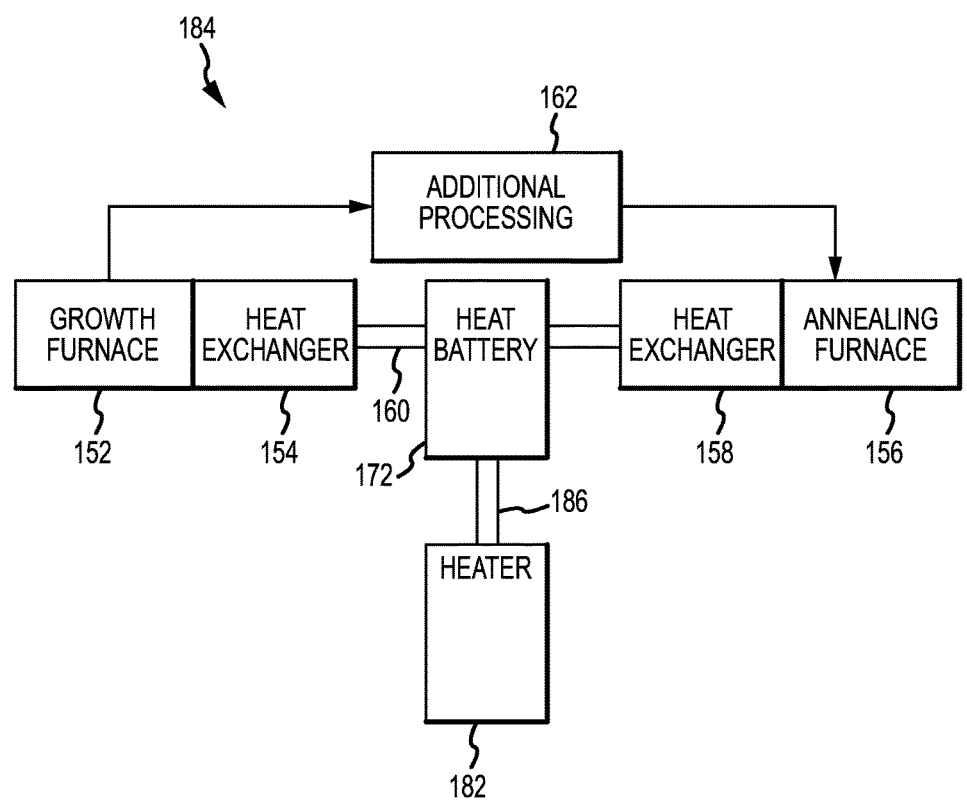
FIG. 7 illustrates still another system for recycling heat in sapphire processing by implementing a central heater to supply heat to a heat battery which receives and distributes heat to the furnaces.
Figure 8:
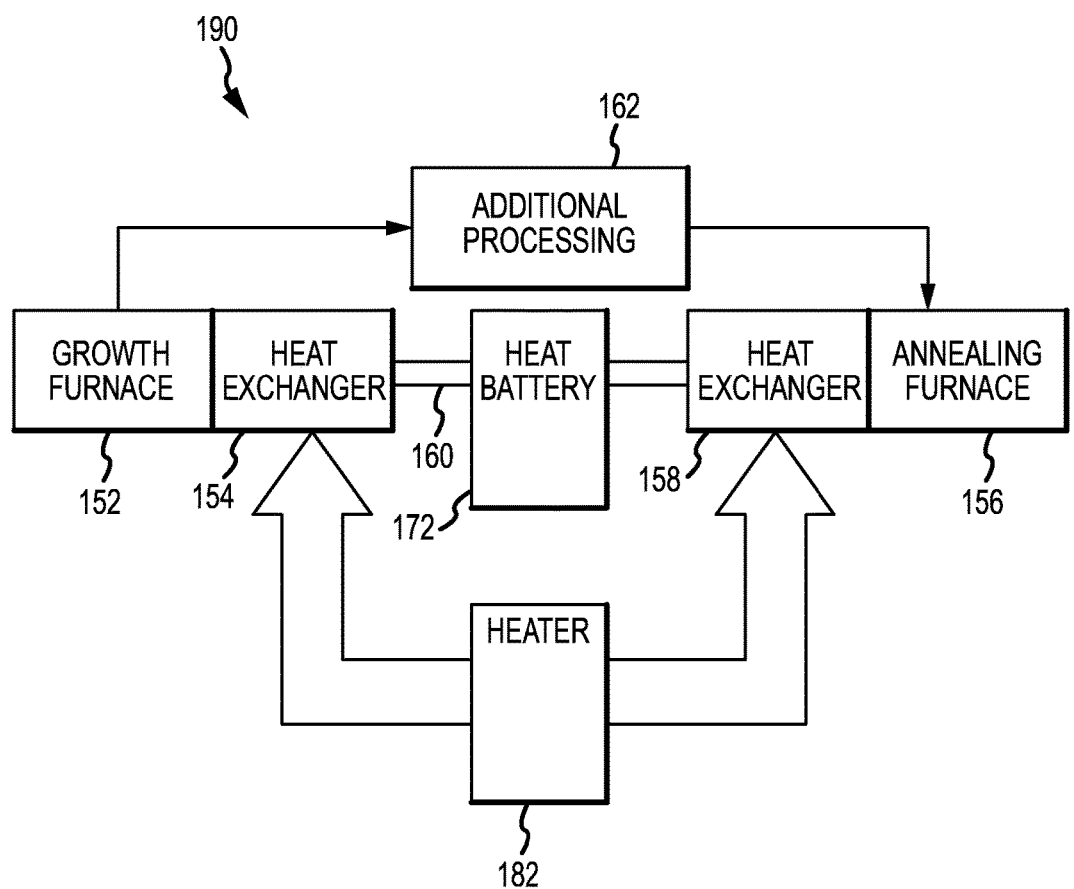
FIG. 8 illustrates a further system for recycling heat in sapphire processing by implementing a central heater to preheat the furnaces and a heat battery to recycle heat from the furnaces.

FIGS. 7 and 8 illustrate still further alternative systems 184, 190 utilizing the heat battery 172 and the central heater 182. In the system 184 of FIG. 7, the central heater 182 may feed directly into the heat battery 172 and the heat battery may then distribute the heat. Alternatively, in the system 190 of FIG. 8, the central heater 182 may directly heat the furnaces. The furnaces may additionally be heated by the heat battery 172 and supply heat to the battery upon completion of a heating step.

Figure 9:
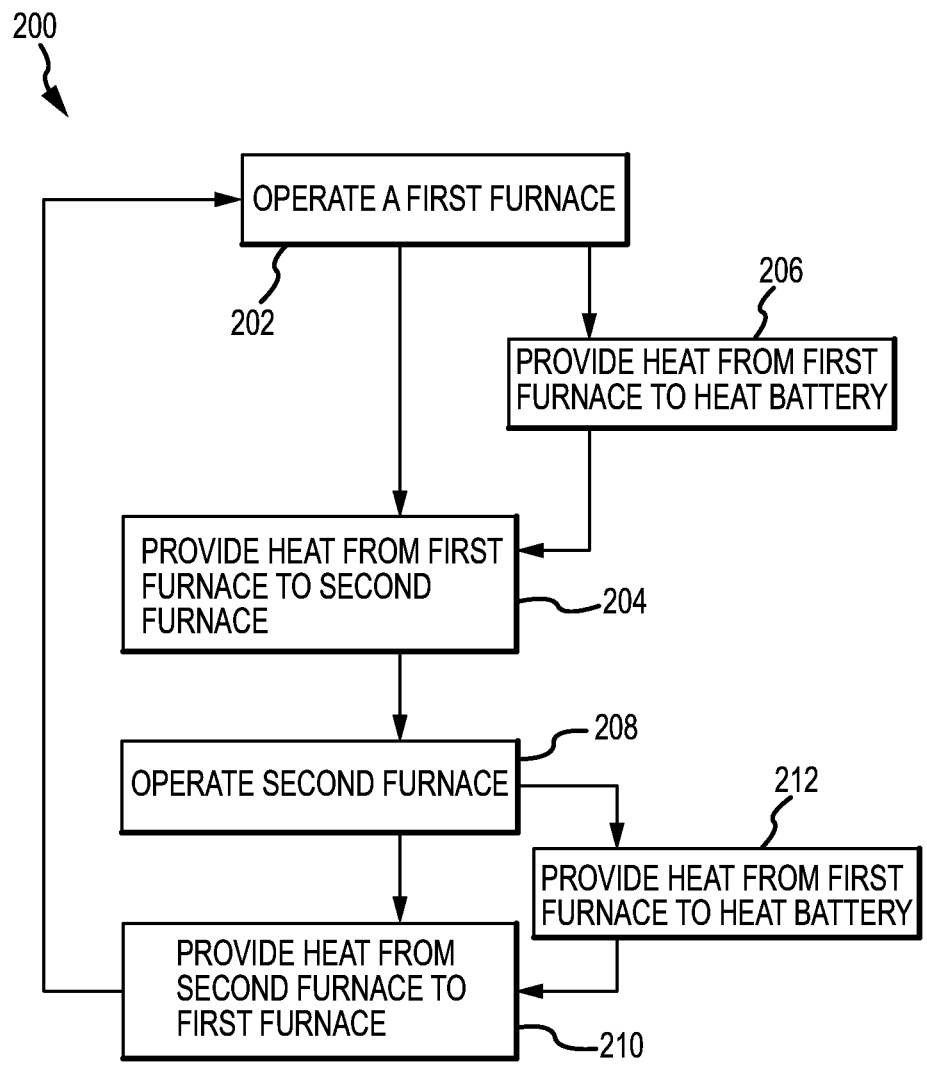
FIG. 9 is a flow chart illustrating a sample method of operating a sapphire growth and annealing system.

FIG. 9 is a flow chart illustrating an example method 200 of operating a sapphire growth and annealing system in accordance with an example embodiment. Initially, the method 200 includes operating a first furnace (Block 202). Upon completion of the first heating step, heat from the first furnace may be supplied to either a second furnace to preheat the second furnace (Block 204) or it may be provided to a heat battery (Block 206). If the heat is provided to the heat battery, the heat may be stored in the battery until it is eventually provided to the second furnace (Block 204) to preheat the second furnace. Once the second furnace is preheated, the second furnace may operate (Block 208) to further raise the temperature of the second furnace. Upon completion of the second furnace's operation, heat may be transferred out of the second furnace to either the first furnace (Block 210) to preheat the first furnace or back to the heat battery (Block 212) and the first furnace may be operated again (Block 202). It should be appreciated that in some embodiments, heat may be transferred out of the furnaces during prior to completion of a heating step to help maintain the temperature of the furnace at a desired level. The heat may be transferred to the battery or to another furnace.

The heat from may be transferred between the furnaces (and to or from the heat battery) in any suitable manner. In some embodiments, a thermal fluid may be used. For example, water, pressurized steam, alcohol, a solution or molten salts may be used. Additionally, it should be appreciated that a central heater may be utilized to either preheat one or more furnace or to charge the heat battery.

Although the foregoing discussion has presented specific embodiments, persons skilled in the art will recognize that changes may be made in form and detail without departing from the spirit and scope of the embodiments. For example, heat extracted during a cooling phase may be recycled as well as the heat from heating stages. As such, the heat exchangers may be utilized in both heating and cooling stages to help conserve and recycle the heat of the system. Accordingly, the specific embodiments described herein should be understood as examples and not limiting the scope thereof.

What is claimed is:

1. A system for processing corundum, comprising:
 a sapphire growth apparatus, comprising:
  a first furnace configured to grow a sapphire crystal from a seed material;
  a crucible positioned within the first furnace and configured to maintain an orientation of the seed material during a growth of the sapphire crystal; and
  an extraction assembly configured to remove the sapphire crystal from the crucible;
 a second furnace configured to anneal the sapphire crystal grown by the first furnace by heating the sapphire material to an annealing temperature that is distinct from an operational temperature for the first furnace, the second furnace in communication with, and separated from, the first furnace via an insulated network of piping and comprising a heating element;
a heat battery configured for heat storage; and
a heat exchanger configured for transfer of energy between at least one of:
from the first furnace to the heat battery; or
from the heat battery to the second furnace;
wherein the second furnace is configured to:
receive heat from the first furnace via the heat exchanger and the heat battery to preheat the second furnace; and
use the heating element to achieve the annealing temperature.

2. The system of claim 1 further comprising at least one cooling system, wherein energy extracted from the cooling system is used in at least one of the first or second furnaces.

3. The system of claim 1 wherein:
the heat exchanger is a first heat exchanger configured for transfer of energy between the first furnace and the heat battery; and
the system further comprises a second heat exchanger configured for transfer of energy between the second furnace and the heat battery.

4. The system of claim 1, wherein the heat exchanger is configured to transfer energy between both of:
from the first furnace to the heat battery; and
from the heat battery to the second furnace.

5. The system of claim 1, wherein heat from at least one of the first and second furnaces is provided to an additional heat exchanger to heat water or air for heating and ventilation systems.

6. The system of claim 1, further comprising a central heater configured to provide heat to at least one of the first furnace or second furnace to supplement the heat provided by the first and second furnace.

7. A method of operating multiple furnaces in sapphire processing, the method comprising:
growing a sapphire crystal using a sapphire growth apparatus, the growing including:
maintaining an orientation of a seed material within a crucible; and
heating the crucible using a first furnace operating at a first operational temperature;
growing a sapphire material having a crystal orientation that corresponds to the orientation of the seed material;
transferring heat from the first furnace to a heat battery;
transferring heat from the heat battery to a second furnace; and
annealing the sapphire crystal grown by the sapphire growth apparatus using the second furnace operating at a second operational temperature that is distinct from the first operational temperature.

8. The method of claim 7, wherein the heat from the first furnace is routed to second furnace in the form of a thermal fluid.

9. The method of claim 8, wherein the thermal fluid comprises one of water, pressurized steam, alcohol, a solution or molten salts.

10. The method of claim 7, further comprising:
operating a central heat source; and
routing heat from the central heat source to at least one of the first and second furnaces.

11. The method of claim 7, wherein the heat from the central heat source is used in preliminary heating of at least one of the first and second furnaces.

12. A heating system for sapphire production, comprising:
a heat battery configured for heat storage;
a plurality of furnaces, a first and a second furnace of the plurality of furnaces configured to sequentially process a sapphire material, each furnace comprising a heat exchanger;
a crucible positioned within one of the plurality of furnaces and configured to maintain an orientation of a seed material during a growth of a sapphire crystal;
an extraction assembly operative to extract the sapphire crystal from the crucible for subsequent processing; and
an insulated network of piping in communication with the heat battery and each of the plurality of furnaces, wherein heat is transferred via the heat exchangers between the heat battery and the plurality of furnaces using the insulated network of piping, wherein:
heat from the first furnace of the plurality of furnaces is used to preheat the second furnace subsequent to the first furnace being heated to and operating at a first operational temperature for the first furnace; and
the second furnace, subsequent to the preheat, is configured to anneal the sapphire crystal formed by the sapphire growth apparatus at a second operational temperature that is distinct from the first operational temperature.

13. The heating system of claim 12, wherein at least one of the plurality of furnaces comprises an electrical furnace.

14. The heating system of claim 12, wherein the first furnace is dedicated to heating during a growth phase of sapphire.

15. The heating system of claim 12, wherein the second furnace is dedicated to heating during a sapphire annealing phase.

16. The system of claim 1, wherein the sapphire growth apparatus is configured to grow the sapphire crystal using one of the Kyropoulos process, the edge-defined film-fed growth process, or the vertical horizontal gradient freezing process.

* * * * *